United States Patent

Peng

[11] Patent Number: 6,120,606
[45] Date of Patent: Sep. 19, 2000

[54] GAS VENT SYSTEM FOR A VACUUM CHAMBER

[75] Inventor: Ming-Tang Peng, Hsinchu, Taiwan

[73] Assignee: Acer Semiconductor Manufacturing Inc., Hsinchu, Taiwan

[21] Appl. No.: 09/105,338

[22] Filed: Jun. 26, 1998

[51] Int. Cl.$^7$ .................................................. C23C 16/00
[52] U.S. Cl. .............................. 118/719; 118/50; 118/733; 414/935; 414/939; 417/306; 137/110; 137/111; 137/587; 137/599; 137/624.11; 454/238; 454/255
[58] Field of Search .............................. 118/50, 719, 733; 414/935, 939; 417/306; 137/110, 111, 587, 599, 624.11; 454/238, 255

[56] References Cited

U.S. PATENT DOCUMENTS

| | | |
|---|---|---|
| 3,516,429 | 6/1970 | Sandstede et al. . |
| 3,847,173 | 11/1974 | Hill . |
| 4,341,234 | 7/1982 | Meinass et al. . |
| 4,910,042 | 3/1990 | Hokynar . |
| 5,308,989 | 5/1994 | Brubaker . |
| 5,385,505 | 1/1995 | Sharp et al. . |
| 5,759,214 | 6/1998 | Ohmi et al. . |

OTHER PUBLICATIONS

Perry's Chemical Engineers' Handbook, 6th Ed., pp. 6–94 to 6.96, 1984.

*Primary Examiner*—Stanley S. Silverman
*Assistant Examiner*—Michael P. Colaianni
*Attorney, Agent, or Firm*—Harness, Dickey & Pierce, P.L.C.

[57] ABSTRACT

The present invention provides a gas vent system for a vacuum chamber. The particle placed onto the wafer after loading out from a vacuum chamber can be greatly reduced by the system design. The gas vent system has a gas supply, an anti-vibrating tube, a gas regulator, a first line, a second line, a vent valve, and a filter. The anti-vibrating tube is connected after the gas supply for transferring gas without introducing vibration. The gas regulator is connected after the anti-vibrating tube for controlling a flow rate of the gas. The first line is connected after the gas regulator and has a first metering valve. The second line is connected after the gas regulator and is also connected in parallel with the first line. The second line has a second metering valve and an in-line valve in series. The vent valve is connected after the first line and the second line. The filter is connected between the vent valve and the vacuum chamber. In addition, the gas vent system can further include a pressure sensor for detecting a pressure of the vacuum chamber.

16 Claims, 2 Drawing Sheets

GAS VENT SYSTEM FOR A VACUUM CHAMBER

FIELD OF THE INVENTION

The present invention relates to a gas vent system, and more specifically, to a gas vent system for a vacuum chamber. The gas vent system can be employed in a wafer transfer chamber to solve the particle contamination problem.

BACKGROUND OF THE INVENTION

In semiconductor manufacturing processes, lots of manufacturing or inspection processes are performed in a vacuum environment with a pressure much lower than atmospheric pressure. In order to maintain the low pressure environment in the main processing chamber, the design concept of using a transfer chamber is employed. The transfer chamber is used to transfer a wafer or wafers into the processing or specimen chamber without damaging the low pressure condition in the vacuum environments.

Without limiting the scope of the present invention, the process of gas vent in a transfer chamber is illustrated with a SEM (scanning electron microscope) system. Referring to FIG. 1, a SEM specimen chamber (SC) 10 with accompanying load chamber (LC) 12 and transfer chamber (XC) 14 is illustrated. Since the SEM inspection is performed with the generation of an electron beam, a vacuum environment is needed in the specimen chamber 10 to provide low pressure. A wafer can be loaded into the specimen chamber 10 from the environment with the atmospheric pressure without influencing the vacuum condition of the specimen chamber design.

In general, the wafer to be inspected is loaded into the transfer chamber 14 at one atmospheric pressure (1 atm). The lead or cover 14a of the transfer chamber 14 is closed and the pressure is low down to the specified pressure of the vacuum requirements. The pressure can be drawn down by a well-known pump system. The wafer is then transferred into the specimen chamber 10 through the transformation of the load chamber 12. Thus the vacuum environment in the specimen chamber 10 can be maintained by the pressure regulation in the transfer chamber 14. After the SEM inspection process of the wafer in finished, the wafer is transferred back into the transfer chamber 14 through the load chamber 12. The pressure in the transfer chamber 14 is raised up by a gas vent system 16 which supplies gas to increase the pressure in the transfer chamber to one atmospheric pressure (1 atm).

During the gas vent process in the transfer chamber 14, the gas flow rate and cleanness of the supplying gas must be carefully controlled. In general, the pressure in the transfer chamber is very low. As an example, the pressure can be as low as about 100 mTorr (mili-Torr) to about 20 mTorr for the SEM system. In such a low pressure, any abrupt pressure change during the vent process can induce a strong gas flow and air turbulence. The gas flow causes a serious problem of particle redistribution and the wafer suffers from the particle contamination problem after the vent process.

In the traditional design of the gas vent system 16, only a set of valves are used to control the gas flow. Thus the vent process with a high pressure difference and gas flow-induced friction distributes lots of undesired particles to the wafer. In the conventional vent process, the wafer is found to have several hundred particles added after the process. The particle contamination problem can influence the yield of the process and even damage the devices on the wafer. For performing an inspection process free of the particle contamination problem, a modified or redesigned vent system is highly needed.

SUMMARY OF THE INVENTION

A vent system for a vacuum transfer chamber is disclosed in the present invention. With the design of parallel arranged first line and second line with different gas supplying rate, the vent gas flow can be well-controlled. The particle contamination problem on the wafer in the conventional gas vent system can be improved.

The present invention discloses a gas vent system for a vacuum chamber. The system has a gas supply, an anti-vibrating tube, a gas regulator, a first line, a second line, a vent valve, and a filter. The anti-vibrating tube is connected after the gas supply for transferring gas without introducing vibration from the gas supply to the vacuum chamber. The gas regulator is connected after the anti-vibrating tube for controlling a flow rate of the gas. The first line is connected after the gas regulator and has a first metering valve. The second line is connected after the gas regulator and is also connected in parallel with the first line. The second line has a second metering valve and an in-line valve in series. The vent valve is connected after the first line and the second line. The filter is connected between the vent valve and the vacuum chamber. In addition, the gas vent system can further include a pressure sensor for detecting a pressure of the vacuum chamber.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED DESCRIPTION OF THE PREFERRED EMBODIMENT

The present invention provides a gas vent system for a vacuum chamber. The gas vent system has a first line and a second line in parallel to provide different gas flow at a different vent stage. A fine tuned gas flow with a low flow rate can be provided by the first line at the initial stage of the vent process. A larger gas flow is then supplied by the addition of the gas flow through the second line. Thus the particle redistribution problem in the conventional vent system design can be eliminated. The particle placed onto the wafer after loading out from a vacuum chamber can be greatly reduced.

Figure 1:
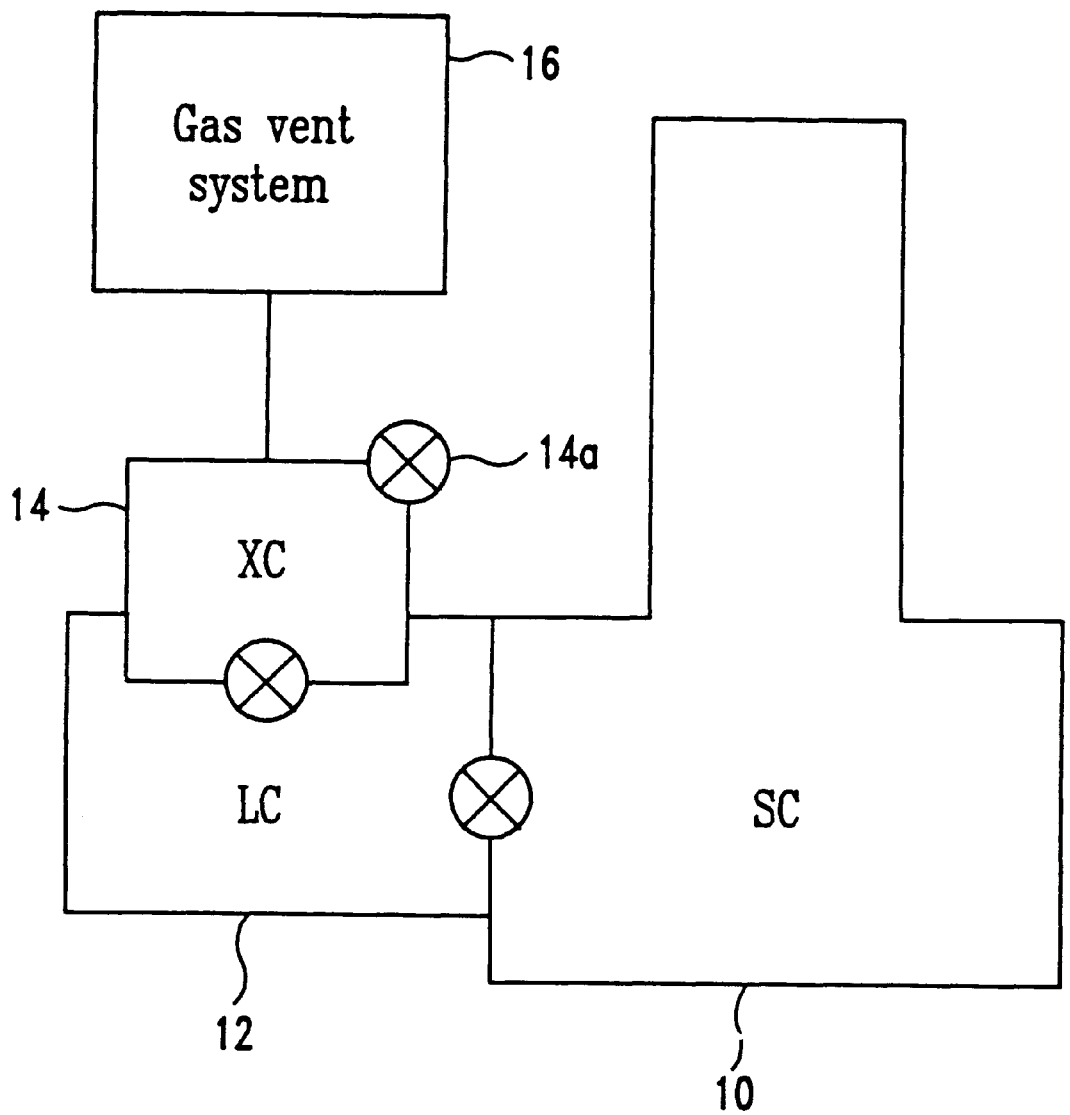
FIG. 1 illustrates a prior art schematic system diagram of a SEM system with a gas vent system.

Without limiting the scope and the spirit of the present invention, the application of the vent system in a transfer chamber of a SEM system is illustrated in detail. The vent system can be used to replace the conventional gas vent system 16 for the transfer chamber 14 in the SEM system illustrated in the background of the invention, as shown in FIG. 1. However, the vent system of the present invention can be applied on various kinds of vacuum chambers to perform the vent process to raise the pressure from a vacuum state to an atmospheric state.

Figure 2:
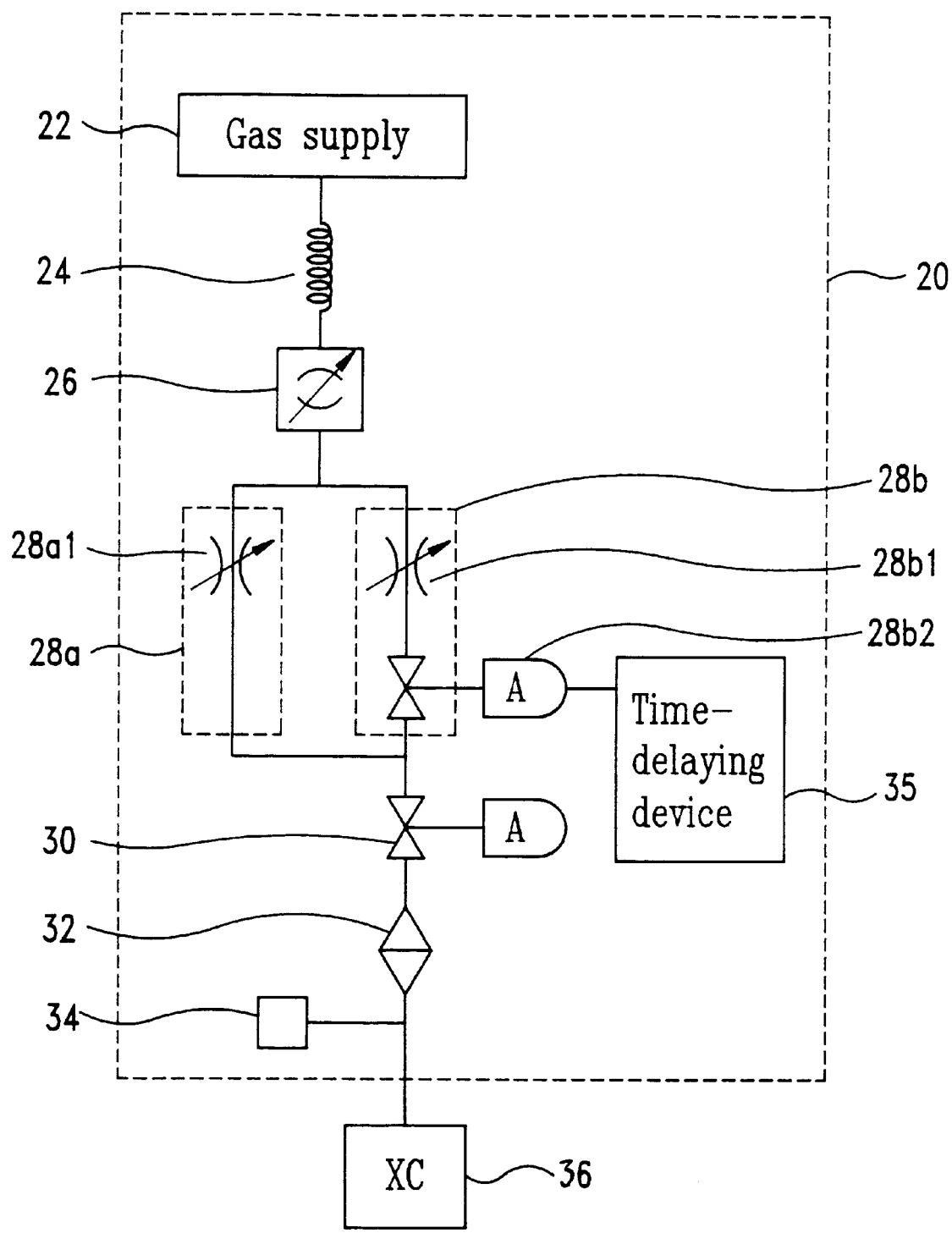
FIG. 2 illustrates a schematic system diagram of a gas vent system in accordance with the present invention.

Referring to FIG. 2, the gas vent system 20 is connected to a vacuum chamber, namely the transfer chamber 36 in the embodiment. The chamber 36 can be a wafer transfer chamber for a scanning electron microscope (SEM) system. The chamber 36 also can be a wafer transfer chamber for another system or processing chambers in which a vacuum environment is needed, like a LPCVD (low pressure chemical vapor deposition) chamber or a plasma etching chamber. The gas vent system includes a gas supply 22, an anti-vibrating tube 24, a gas regulator 26, a first line 28a, a second line 28b, a vent valve 30, and a filter 32. The gas supply supplies the gas needed to vent the transfer chamber 36 to a raised pressure or the atmospheric pressure. In the case, a facility gas valve box at the POU (point of user) end is used. Nitrogen can be supplied as the vent gas in the preferred embodiment.

The anti-vibrating tube 24 is connected after the gas supply 22 for transferring gas. The SEM system is a high magnification and high resolution surface inspection system, thus the SEM system is very sensitive to vibration. The anti-vibrating tube 24 is employed to connect between the gas supply 22 and the chamber 36 to prevent the conduction of undesired vibration. The vibration from the gas supply 22 can be damped by the anti-vibrating tube 24 without introducing vibration to the system. In this case, a flexible metal tube is used as the anti-vibrating tube to minimize gas leakage and to reduce vibration. A well-known bellow-type tube can be used with good flexibility and gas sealing characteristics.

The gas regulator 26 is connected after the anti-vibrating tube 24 for controlling the flow rate of the gas. A regulator with an adjustable range between about 0.1 kg/cm$^2$ to about 3 kg/cm$^2$ can be used in the embodiment. The gas regulator 26 serves as a major flow rate controller in the vent system 20. The flow rate through the subsequent stage of the first line 28a and the second line 28b can be tuned further and are proportional to the adjustment in the gas regulator 26.

The first line 28a is connected after the gas regulator 26. The first line 28a has a first valve 28a1. The second line 28b is also connected after the gas regulator 26 and is connected in parallel with the first line 28a. The second line 28b has a second valve and an in-line valve 28b2 in series. The in-line valve 28b2 is used to switch the flow through the second line 28b. Thus, the first line 28a and the second line 28b can be opened at different times to control the gas vent process at two stages. In order to accurately control the gas flow through the first line 28a and the second line 28b, the first valve 28a1 and the second valve 28b1 can be metering valves or needle valves. In this case, the metering valve 28a1 is a fine flow rate tuning valve and the second metering valve 28b1 is a coarse flow rate tuning valve. The in-line valve 28b2 can be an air-operated valve.

The vent valve 30 is connected after the first line 28a and the second line 28b. The vent valve 30 can be an air-operated valve to control the vent operation of the vent system 20. Finally, a filter 32 is connected between the vent valve 30 and the chamber 36. The filter 32 is placed as a last stage of the vent system 20. Thus, any particle generated in the tube or carried by the gas can be filtered out. Thus a clean gas can be supplied into the chamber 36. In addition, a pressure sensor 34 can be added to detect the pressure in the chamber 36. The pressure sensor 34 can be connected to the chamber 36 or connected with a pipe between the filter 32 the chamber 36.

For the system described as above, a lot of connecting devices are needed between the gas supply 22, the anti-vibrating tube 24, the gas regulator 26, the first metering valve 28a1, the second metering valve 28b1, the in-line valve 28b2, the vent valve 30, and the filter 32. In the case, sealings with metal gaskets can be employed as the connecting devices to provide a low leakage system. As an example, the metal gasket face seal fittings sold under the trademark VCR of Cajon company can be employed.

With the gas vent system 20 of the present invention, the operation is illustrated as follows. After an SEM inspection process is done to a wafer, the wafer is loaded into the transfer chamber 36. At first, the vent valve 30 and the in-line valve 28b2 of the second line 28b is closed to maintain the vacuum state in the chamber 36. The first stage vent process is initialized by opening the vent valve 30. A gas flow is provided through the first line 28a and the flow rate is limited at a low value through the fine-tuned metering valve 28a1. Thus the particle generated under the pressure difference and the friction is minimized. The pressure in the chamber 36 is then increased gradually.

At the second stage of the vent process, the in-line valve 28b2 is opened and the gas flow rate is increased with an amount set at the second valve 28b1. The flow rate of the gas is much larger and the vent process can be shortened in time. Since the pressure in the chamber 36 has raised in the first vent stage, the particle generation problem by the increase of the flow rate in the second vent stage can be suppressed. When the pressure in the chamber 36 reaches nearly one atmospheric pressure (1 atm), the pressure sensor 34 signals the system to end the vent process by closing the valves 28b2 and 30. The lead of the chamber 36 can opened to load out the wafer. Thus the gas flow is well-controlled in the two-stage vent process and the particle contamination problem in the conventional system design can be eliminated. With the vent system in the present invention, the number of particles added after the SEM inspection, is less than 20 for particles larger than 0.2 micrometer. The number is much less than the one in the conventional system, in which hundreds of particles are added to cause a serious particle contamination problem.

The time delay between the opening of the valve 32 and the in-line valve 28b2 can be controlled manually. In the preferred embodiment, the time delay can be controlled automatically by a time delaying device 35, as shown in FIG. 2. The time delaying device 35 can be a mechanical switch or an electrical timing circuit which are well-known in the art. In this case, the time delay is set between about 5 seconds to about 15 seconds and the vent process with the two stages can be finished in about 25 to about 50 seconds.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A gas vent system for vacuum chamber, said system comprising:

a gas supply;

an anti-vibrating tube connected after said gas supply for transferring gas without introducing vibration from said gas supply to said vacuum chamber;

a gas regulator connected after said anti-vibrating tube for controlling a flow rate of said gas;

a first line with a first metering valve connected after said gas regulator, said first lines allowing said gas to pass through into said vacuum chamber in a first flow rate for minimizing generated particles due to a pressure difference when venting said gas into said vacuum chamber;

a second line connected after said gas regulator, said second line being connected in parallel with said first line, said second line having a second metering valve and an in-line valve in series, after said first line starts to vent said gas into said vacuum chamber, said second line allowing said gas to pass through into said vacuum chamber in a second flow rate higher than said first flow rate for increasing a venting rate of said vacuum chamber by opening said first line and said second line at a same time;

a vent valve connected after said first line and said second line but before the vacuum chamber; and a filter connected between said vent valve and said vacuum chamber.

2. The system of claim 1 further comprising a pressure sensor for detecting a pressure of said vacuum chamber.

3. The system of claim 1, wherein said chamber is a wafer transfer chamber for a scanning electron microscope system.

4. The system of claim 1, wherein said gas comprises nitrogen.

5. The system of claim 1, wherein said gas supply comprises a facility gas valve box.

6. The system of claim 1, wherein said anti-vibrating tube comprises a flexible metal tube.

7. The system of claim 1, wherein said anti-vibrating tube comprises a bellow-type tube.

8. The system of claim 1, wherein said in-line valve comprises a first air-operated valve.

9. The system of claim 1, wherein said vent valve comprises a second air-operated valve.

10. The system of claim 1, wherein said gas supply, said anti-vibrating tube, said gas regulator, said first metering valve, said second metering valve, said in-line valve, said vent valve, and said filter are connected by sealings with metal gaskets.

11. The system of claim 1 further comprising a time delaying device for controlling a valve opening time delay between said vent valve and said in-line valve.

12. A gas vent system for a vacuum chamber, said chamber being a wafer transfer chamber for a scanning electron microscope device, said system comprising:

a gas supply for supplying nitrogen;

an anti-vibrating tube connected after said gas supply for transferring gas without introducing vibration from said gas supply to said vacuum chamber;

a gas regulator connected after said anti-vibrating tube for controlling a flow rate of said gas;

a first line with a first metering valve connected after said gas regulator, said first line allowing said gas to pass through into said vacuum chamber in a first flow rate for minimizing generated particles due to a pressure difference when venting said gas into said vacuum chamber;

a second line connected after said gas regulator, said second line being connected in parallel with said first line, said second line having a second metering valve and an in-line valve in series, after said first line starts to vent said gas into said vacuum chamber, said second line allowing said gas to pass through into said vacuum chamber in a second flow rate higher than said first flow rate for increasing a venting rate of said vacuum chamber by opening said first line and said second line at a same time;

a vent valve connected after said first line and said second line but before said vacuum chamber;

a time delaying device for controlling a valve opening time delay between said vent valve and said in-line valve, thereby lagging said second line to open behind said first line;

a filter connected between said vent valve and said vacuum chamber; and a pressure sensor for detecting a pressure of said vacuum chamber.

13. The system of claim 12, wherein said anti-vibrating tube comprises a flexible metal tube.

14. The system of claim 12, wherein said in-line valve comprises a first air-operated valve.

15. The system of claim 12, wherein said vent valve comprises a second air-operated valve.

16. The system of claim 12, wherein said gas supply, said anti-vibrating tube, said gas regulator, said first metering valve, said second metering valve, said in-line valve, said vent valve, and said filter are connected by sealings with metal gaskets.

* * * * *